US008759925B2

(12) United States Patent
Umezawa et al.

(10) Patent No.: US 8,759,925 B2
(45) Date of Patent: Jun. 24, 2014

(54) METHOD FOR REDUCING THICKNESS OF INTERFACIAL LAYER, METHOD FOR FORMING HIGH DIELECTRIC CONSTANT GATE INSULATING FILM, HIGH DIELECTRIC CONSTANT GATE INSULATING FILM, HIGH DIELECTRIC CONSTANT GATE OXIDE FILM, AND TRANSISTOR HAVING HIGH DIELECTRIC CONSTANT GATE OXIDE FILM

(71) Applicant: National Institute for Materials Science, Ibaraki (JP)

(72) Inventors: Naoto Umezawa, Ibaraki (JP); Toyohiro Chikyo, Ibaraki (JP); Toshihide Nabatame, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 14/046,339

(22) Filed: Oct. 4, 2013

(65) Prior Publication Data
US 2014/0061872 A1    Mar. 6, 2014

Related U.S. Application Data

(60) Division of application No. 13/482,071, filed on May 29, 2012, now Pat. No. 8,575,038, which is a continuation of application No. PCT/JP2010/071353, filed on Nov. 30, 2010.

(30) Foreign Application Priority Data

Dec. 1, 2009    (JP) .................................. 2009-273000

(51) Int. Cl.
H01L 21/316    (2006.01)

(52) U.S. Cl.
USPC .......................................... 257/410; 257/411

(58) Field of Classification Search
USPC ............ 257/410, 411, 635, E29.165, E21.29;
438/216, 261, 287, 460, 591, 761, 763,
438/778, 785
See application file for complete search history.

(56) References Cited

U.S. PATENT DOCUMENTS 6,057,584 A    5/2000  Gardner et al.
6,617,209 B1 *  9/2003  Chau et al. .................... 438/240

(Continued)

FOREIGN PATENT DOCUMENTS

JP    2003-204058    7/2003
JP    2007-173796    7/2007

OTHER PUBLICATIONS

Li, M. et al., Hafnium titanate as a high permittivity gate insulator: Electrical and physical characteristics and thermodynamic stability, Journal of Applied Physics 101, 044509, 2007.

(Continued)

*Primary Examiner* — Roy Potter
(74) *Attorney, Agent, or Firm* — Carmody Torrance Sandak & Hennessey LLP (57) ABSTRACT

To provide a method for reducing a thickness of an interfacial layer, which contains: (a) forming a film of an oxide of a first metal on a semiconductor layer via an oxide film of a semiconductor serving as an interfacial layer; and (b) forming a film of an oxide of a second metal on the film of the oxide of the first metal, where the second metal has higher valency than that of the first metal.

5 Claims, 11 Drawing Sheets

(56) References Cited

U.S. PATENT DOCUMENTS

| | | | |
|---|---|---|---|
| 6,696,327 B1 * | 2/2004 | Brask et al. | 438/197 |
| 7,396,777 B2 * | 7/2008 | Jung et al. | 438/778 |
| 8,575,038 B2 * | 11/2013 | Umezawa et al. | 438/761 |
| 2007/0138578 A1 | 6/2007 | Callegari et al. | |
| 2008/0299730 A1 | 12/2008 | Callegari et al. | |

OTHER PUBLICATIONS

Alshareef, H.N. et al., Work function engineering using lanthanum oxide interfacial layers, Applied Physics Letters 89, 232103, 2006.

Kundu, M. et al., Effect of $Al_2O_3$ capping layer on suppression of interfacial $SiO_2$ growth in $HfO_2$/ultrathin $SiO_2$/Si(001) structure, Applied Physics Letters, vol. 82, No. 20, pp. 3442-3444, May 19, 2003.

Kim, H. et al., Engineering chemically abrupt high-k metal oxide/silicon interfaces using an oxygen-gettering metal overlayer, Journal of Applied Physics, vol. 96, No. 6, pp. 3467-3472, Sep. 15, 2004.

Agustin, M.P., et al., Influence of AlN layers on the interface stability of $HfO_2$ gate dielectric stacks, Applied Physics Letters 89, 041906, 2006.

Passlack, M. et al., Interface charge and nonradiative carrier recombination in $Ga_2O_3$—GaAs interface structures, Journal of Vacuum Science & Technology, B17(1), pp. 49-52, Jan./Feb. 1999.

Shahrjerdi, D et al., Unpinned metal gate/high-K GaAs capacitors: Fabrication and characterization, Applied Physics Letters 89, 043501, 2006.

Akazawa, M., et al., Capacitance-voltage and photoluminescence study of high-k/GaAs interfaces controlled by Si interface control layer, Journal of Vacuum Science & Technology, B27(4), 2028-2035, Jul./Aug. 2009.

Umezawa, N. et al., Theoretical model for artificial structure modulation of $HfO_2/SiO_x$/Si interface by deposition of a dopant material, Applied Physics Letters 100, 092904, 2012.

Kubaschewski, O., et al., Materials Thermochemistry $6^{th}$ edition, Pergamon Press, Apr. 1993, Chapter 5, p. 281 and p. 312.

* cited by examiner

METHOD FOR REDUCING THICKNESS OF INTERFACIAL LAYER, METHOD FOR FORMING HIGH DIELECTRIC CONSTANT GATE INSULATING FILM, HIGH DIELECTRIC CONSTANT GATE INSULATING FILM, HIGH DIELECTRIC CONSTANT GATE OXIDE FILM, AND TRANSISTOR HAVING HIGH DIELECTRIC CONSTANT GATE OXIDE FILM

CROSS REFERENCE TO RELATED APPLICATIONS

This application is a divisional of U.S. application Ser. No. 13/482,071, filed May 29, 2012, which is a continuation of PCTJP2010/071353, filed on Nov. 30, 2010, the entire contents of which are incorporated herein by reference.

BACKGROUND OF THE INVENTION

1. Field of the Invention

The present invention relates to a method for reducing a thickness of an interfacial layer, a method for forming a high dielectric constant gate insulating film, a high dielectric constant gate insulating film, a high dielectric constant gate oxide film, and transistor having a high dielectric constant gate oxide film, particularly relating to a method for controlling a structure of solid interface, and to a structure of a gate stack.

2. Description of the Related Art

Along the trends for miniaturizing elements on an integrated circuit, as a gate insulating film, an oxide film of high dielectric constant, such as $HfO_2$ and $La_2O_3$, has been used, replacing the conventionally used silicon oxide.

When such high dielectric oxide film is formed on a substrate of Si or Ge, an interfacial layer, such as $SiO_x$ and $GeO_x$, is formed at the interface between the oxide film and the substrate to lower the effective dielectric constant, which is recognized as a problem. An interfacial layer is formed within a film when a film forming process is performed at high temperature. Even when a high dielectric film is deposited at low temperature, an interfacial layer is still formed by oxygen supplied through the high dielectric film during annealing performed later.

As for such a high dielectric film, for example, $HfO_2$ is used. There has been an attempt to further increase its dielectric constant by adding Ti to $HfO_2$ (for example, Min Li, Zhihong Zhang, Stephen A. Campbella, Hong-Jyh Li and Jeff J. Peterson, "Hafnium titanate as a high permittivity gate insulator: Electrical and physical characteristics and thermodynamic stability," JOURNAL OF APPLIED PHYSICS 101, 044509 (2007)), but it does not substantially solve the aforementioned problem associated with the interfacial layer.

In the past, there was a research where $La_2O_3$ was laminated as a capping layer on $HfO_2$ (for example, H. N. Alshareef, M. Quevedo-Lopez, H. C. Wen, R. Harris, P. Kirsch, P. Majhi, B. H. Lee, R. Jammy, D. J. Lichtenwalner, J. S. Jur, and A. I. Kingon, "Work function engineering using lanthanum oxide interfacial layers," APPLIED PHYSICS LETTERS 89, 232103 (2006)). This related art is however to control the threshold voltage by varying the effective work function of the electrode, not to solve the aforementioned problem associated with the interfacial layer.

Further, there has been an attempt for preventing migration of oxygen by capping $HfO_2$ with $Al_2O_3$ deposited thereon (for example, Manisha Kundu, Noriyuki Miyata, Toshihide Nabatame, Tsuyoshi Horikawa, Masakazu Ichikawa and Akira Toriumi, "Effect of $Al_2O_3$ capping layer on suppression of interfacial $SiO_2$ growth in $HfO_2$/ultrathin $SiO_2$/Si (001) structure," APPLIED PHYSICS LETTERS VOLUME 82, NUMBER 20, 19 May 2003). Since this related art is to prevent oxygen from being diffused from outside of the oxide to the inside thereof, it cannot solve the aforementioned problem by the capping, once the interfacial layer is formed (as described above, an interfacial layer is easily formed).

Furthermore, there has been an attempt for absorbing oxygen from an interfacial layer present below a high dielectric film through the high dielectric film by capping the high dielectric film of $HfO_2$ or the like with Ti, or AlN deposited thereon (for example, H. Kim, et al., "Engineering Chemically Abrupt High-k Metal Oxide/Silicon Interfaces Using an Oxygen-Gettering Metal Overlayer," JOURNAL OF APPLIED PHYSICS 96, 3467 (2004), and M. P. Agustin et al., "Influence of AlN layers on the interface stability of $HfO_2$ gate dielectric stacks," APPLIED PHYSICS LETTERS 89, 041906 (2006)). By withdrawing oxygen from the interfacial layer in this manner, however, oxygen is also withdrawn from the high dielectric film, which increases oxygen voids in the high dielectric film. The presence of the oxygen voids in the high dielectric film becomes a factor for deteriorating reliability of a device, and therefore it is not preferable to solve the aforementioned problem of the interfacial layer using this method.

In the case of a III-V compound semiconductor such as GaAs, there is a problem that numbers of interface defects are formed at an interface between the high dielectric film and GaAs, and layers of $Si/SiN_x$, Ge, and $Ga_2O_3$ are intentionally inserted to prevent such interface defects (for example, M. Passlack, et al., "Interface charge and nonradiative carrier recombination in $Ga_2O_3$.GaAs interface structures," JOURNAL OF VACUUM SCIENCE & TECHNOLOGY, B17(1), January/February 1999, Davood Shahrjerdi, et al., "Unpinned metal gate/high-k GaAs capacitors: Fabrication and characterization," APPLIED PHYSICS LETTERS 89, 043501 (2006), and Masamichi Akazawa, et al., "Capacitance-voltage and photoluminescence study of high-k/GaAs interfaces controlled by Si interface control layer" JOURNAL OF VACUUM SCIENCE & TECHNOLOGY, B27(4), July/August 2009). When these inserted layers are oxidized (when an oxide layer is originally inserted, the oxide layer itself), the same problem as mentioned above is caused so that improvement in properties of a device produced from these semiconductors is inhibited.

SUMMARY OF THE INVENTION

An object of the present invention is to solve the aforementioned problem associated with an interfacial layer by thinning an interfacial layer, which has been formed beneath a high dielectric film without deteriorating the properties of the high dielectric film.

The present invention achieves the aforementioned object by depositing polyvalent metal oxide on a high dielectric oxide film.

According to one aspect of the present invention, the following method for reducing a thickness of an interfacial layer is provided.

That is, a method for reducing a thickness of an interfacial layer, which contains:

(a) forming a film of an oxide of a first metal on a semiconductor layer with an oxide film of a semiconductor serving as an interfacial layer intervening between the film of the oxide of the first metal and the semiconductor layer, where the semiconductor is a semiconductor contained in the semiconductor layer; and (b) forming a film of an oxide of a second metal on the film of the oxide of the first metal, where the second metal has higher valency than that of the first metal.

The oxide of the second metal may have oxygen deficiency from a stoichiometric composition thereof.

The (b) forming may contain depositing the oxide of the second metal on the film of the oxide of the first metal by vapor deposition.

The (b) forming may contain:

(b-1) forming a film of the second metal on the film of the oxide of the first metal; and (b-2) oxidizing the film of the second metal.

A material for forming the semiconductor layer may be silicon, and the interfacial layer may be silicon oxide.

The oxide of the first metal may have larger dielectric constant than that of the silicon oxide.

A material for forming the semiconductor layer may be a III-V compound semiconductor.

The first metal may be at least one metal selected from the group consisting of hafnium (Hf), zirconium (Zr), and titanium (Ti), and the second metal is at least one metal selected from the group consisting of tantalum (Ta), niobium (Nb), and vanadium (V).

The method may further contain:

(c) removing at least part of the film of the oxide of the second metal formed on the film of the oxide of the first metal.

According to another aspect of the present invention, there is provided a method for forming a high dielectric constant gate insulating film, which contains:

forming a high dielectric constant gate insulating film using any of the aforementioned aspects of the method for reducing a thickness of an interfacial layer.

According to yet another aspect of the present invention, there is provided a high dielectric constant gate insulating film formed by any of the aforementioned aspects of the method for reducing a thickness of an interfacial layer.

According to yet another aspect of the present invention, there is provided a high dielectric constant gate oxide film, which contains:

an oxide of a first metal; and a second metal, which is at least one metal selected from metals having higher valency than that of the first metal diffused in the oxide of the first metal, wherein the oxide of the first metal is oxide of at least one metal selected from metals having larger dielectric constant than that of an oxide of a semiconductor layer present below the high dielectric constant gate oxide film, or that of an oxide of a layer provided between the semiconductor layer and the high dielectric constant gate oxide film.

A material for forming the semiconductor layer may be silicon, and the oxide of the first metal may be oxide of at least one metal selected from metals having larger dielectric constant than that of silicon oxide.

The first metal may be at least one metal selected from the group consisting of hafnium (Hf), zirconium (Zr), and titanium (Ti), and the second metal is at least one metal selected from the group consisting of tantalum (Ta), niobium (Nb), and vanadium (V).

The oxide of the first metal may be hafnium oxide, and the second metal may be tantalum.

A concentration of the tantalum may be $10^{20}$ atom/cm$^3$ to $10^{22}$ atom/cm$^3$.

According to yet another aspect of the present invention, there is provided a transistor containing any of the aforementioned aspects of the high dielectric constant gate oxide film.

The present invention can achieve the aforementioned object and reduce a thickness of an interfacial layer, and therefore effective dielectric constant of a gate insulating film can be maintained high in a device using a high dielectric oxide film as the gate insulating film.

DETAILED DESCRIPTION OF THE INVENTION

Examples of the present invention will be specifically explained with reference to drawings hereinafter. In Examples below, specific examples of the present invention are explained for easiness in understanding, but these examples are merely examples of the present invention. The technical scope of the present invention shall be construed as to include the scope of each claim interpreted as wide as possible.

EXAMPLES

Example 1

Here, an example for exhibiting an effect of reducing a thickness of an interfacial layer according to the present invention will be explained in comparison with a comparative example according to the conventional art.

Figure 1:
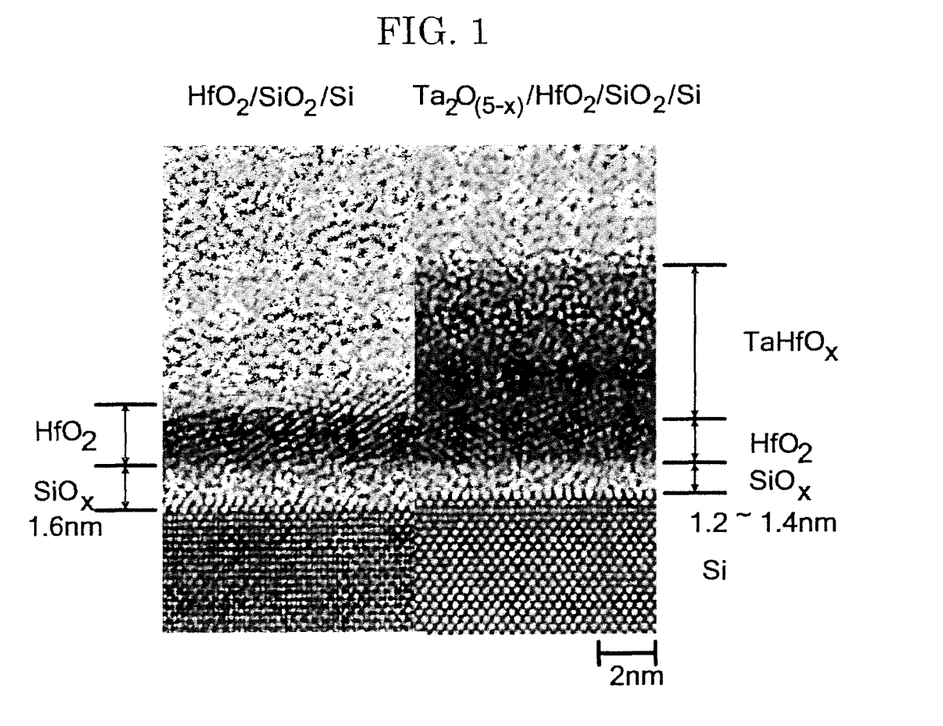
FIG. 1 is a TEM photograph comparing a layer structure of Example of the present invention and that of Comparative Example.

A right half of the photograph of FIG. 1 is a transmission electron microscopic (TEM) photograph of a cross-section of a layer structure produced in one example of the present invention. For the production of this layer structure, a thin silicon oxide ($SiO_2$) film is formed on a Si substrate, followed by forming hafnium oxide ($HfO_2$) film on the $SiO_2$ film. Thereafter, a tantalum oxide ($Ta_2O_{5-x}$) film is formed on the $HfO_2$ film (the reason for using $Ta_2O_{5-x}$, not $Ta_2O_5$, will be explained later).

A more specific production method of the aforementioned layer structure is as follows.

(1) Thin Silicon Oxide Film

After removing a natural oxide film on a surface of the Si substrate with a diluted hydrofluoric acid solution, the Si substrate was treated by subjected to high temperature heating oxidation at 950° C. or higher, to thereby produce the thin silicon oxide film. Note that, the silicon (Si substrate) is oxidized in advance to forming the thin silicon oxide layer, to thereby form an excellent interface having fewer defects with the hafnium oxide film (a film of an oxide of a first metal), and in accordance with the present invention, a thickness of the silicon oxide film, which will be increased by post deposition annealing (PDA) performed in a later step, can be reduced.

(2) Hafnium Oxide Film (Film of Oxide of First Metal)

On the silicon oxide film, a hafnium oxide film was deposited by atomic layer deposition (ALD) using $H_2O$ as an oxygen raw material, and TEMAHf (tetrakis-ethylmethylamido-hafnium:$Hf(NEtMe)_4$) as a hafnium raw material. Thereafter, the resultant was subjected to post deposition annealing (PDA) at 1,050° C. to reduce deficiencies in the deposited film.

(3) Tantalum Oxide Film (Film of Oxide of Second Metal)

On the hafnium oxide film, an oxygen-deficient tantalum oxide ($Ta_2O_{5-x}$) film was formed in a thickness of about 5 nm by low oxygen partial pressure pulsed laser deposition using a tantalum oxide target.

Note that a concentration of tantalum in the tantalum oxide film is preferably $10^{20}$ atom/cm$^3$ to $10^{22}$ atom/cm$^3$.

When the concentration of the tantalum is lower than $10^{20}$ atom/cm$^3$, the diffusion of tantalum in the hafnium oxide film (the first metal oxide film) may be insufficient. When the concentration thereof is higher than $10^{22}$ atom/cm$^3$, the tantalum oxide film absorbs oxygen from the hafnium oxide film to increase deficiencies in the hafnium oxide film, which may deteriorate the quality of the film.

Figure 2A:
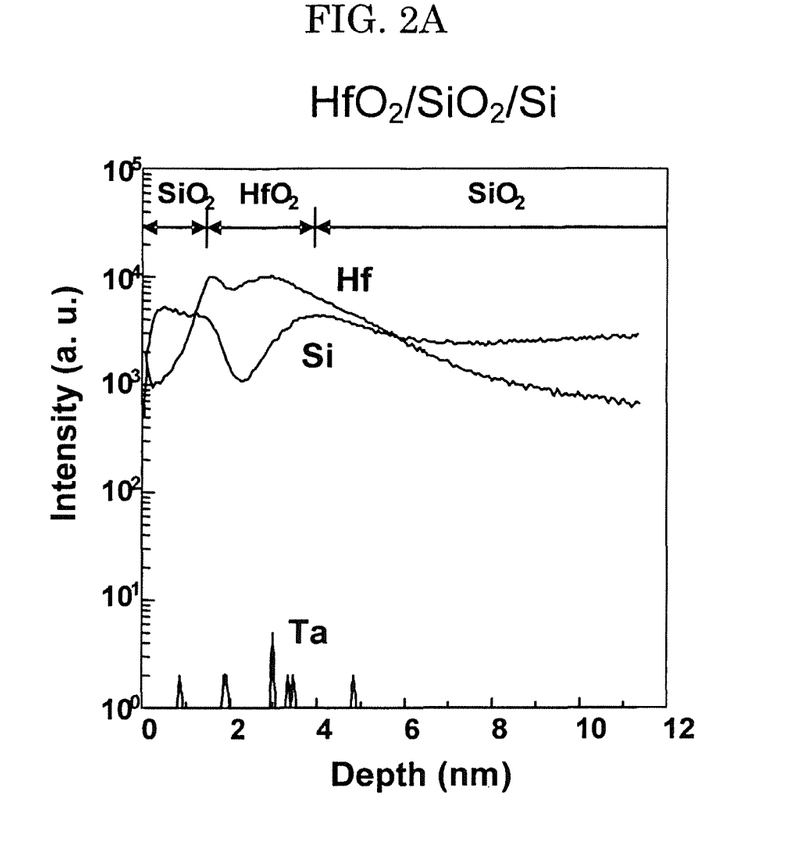
FIG. 2A is a diagram depicting a SIMS measurement result indicating the constituent elements of the layer structure of Example 1.
Figure 2B:
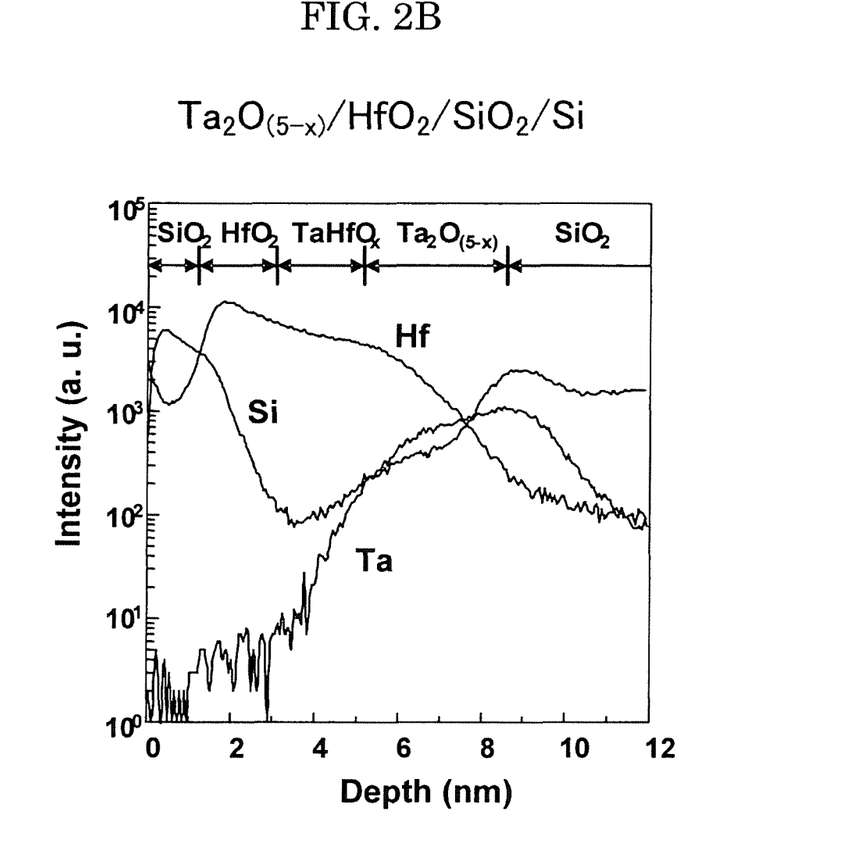
FIG. 2B is a diagram depicting a SIMS measurement result indicating the constituent elements of the layer structure of Comparative Example.

As illustrated in FIGS. 2(a) and 2(b), a silicon oxide film was further provided on the tantalum oxide film. This silicon oxide film was deposited as a protective film to give a strength bearable for a preparation of a sample at the time of a backside SIMS analysis, the results of which are presented in FIGS. 2(a) and 2(b). Accordingly, this silicon oxide film was provided merely for a convenience in a measurement, and it should be noted that the silicone oxide film itself does not give any weight to the present invention. In Comparative Example described below, a silicon oxide film was deposited on a hafnium oxide film for the same purpose.

Comparative Example

A layer structure of Comparative Example was produced in the same manner as in the production of the layer structure of Example 1, provided that the $Ta_2O_{5-x}$ film was not provided. Under the same conditions as those of the photograph of Example 1, a TEM photograph was taken. It is presented in the left side of FIG. 1.

Comparison Between Example 1 and Comparative Example

FIGS. 2(a) and 2(b) depict a graph of the secondary ion mass spectroscopy (SIMIS) measurement result of the layer structure of Example 1 (FIG. 2A) and a graph of the SIMIS measurement result of the layer structure of Comparative Example (FIG. 2B). As understood from these graphs, from the right side of the graph of the layer structure of Example 1, it can be seen that Ta is diffused in $HfO_2$ from the $Ta_2O_{5-x}$ film laminated (deposited) on the $HfO_2$ film. Since Hf is reversely diffused to the side of the $Ta_2O_{5-x}$ film, a substantial amount of Hf is present in the right edge (upper side in the TEM photograph of FIG. 1) in the $Ta_2O_{5-x}$ film. The reason why the upper layer of $HfO_2$ is all indicated as $TaHfO_x$ at the right side of FIG. 1 is to express this condition.

As understood by comparing two TEM photographs in FIG. 1, a thickness of the interfacial layer (the width indicated as $SiO_x$, which is described in this manner as the oxygen content of silicon oxide constituted of the interfacial layer is less than $SiO_2$ which is the stoichiometric composition) in Example 1 is thin, i.e., 1.2 nm to 1.4 nm as $Ta_2O_{5-x}$ is laminated, compared to the thickness thereof of 1.6 nm in Comparative Example.

This function is resulted from that oxygen in the interfacial layer is withdrawn to the side of the $HfO_2$ film during the process of laminating the $Ta_2O_{5-x}$ film.

Figure 3:
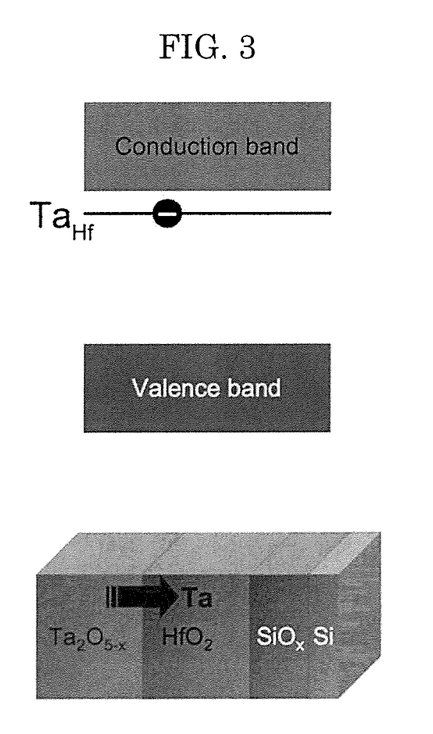
FIG. 3 is a diagram (1) theoretically explaining the effect obtained by laminating $Ta_2O_{5-x}$ on $HfO_2$.
Figure 4:
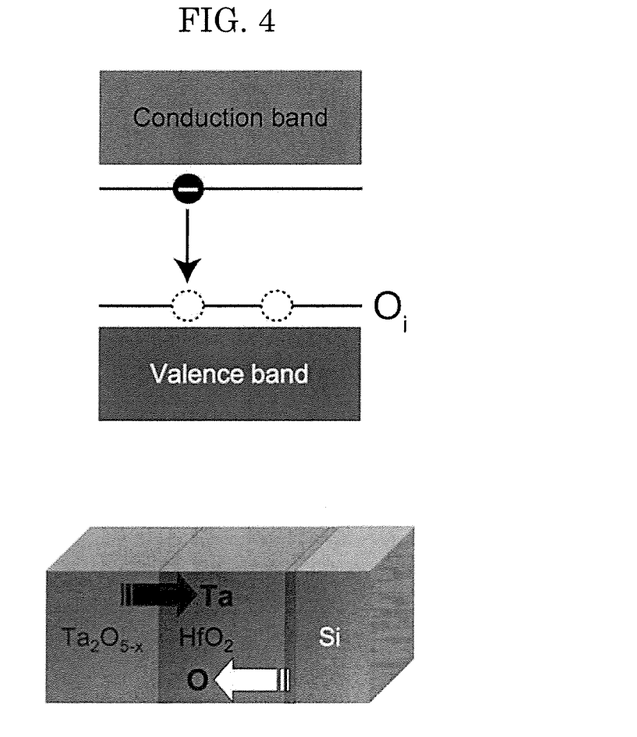
FIG. 4 is a diagram (2) theoretically explaining the effect obtained by laminating $Ta_2O_{5-x}$ on $HfO_2$.
Figure 5:
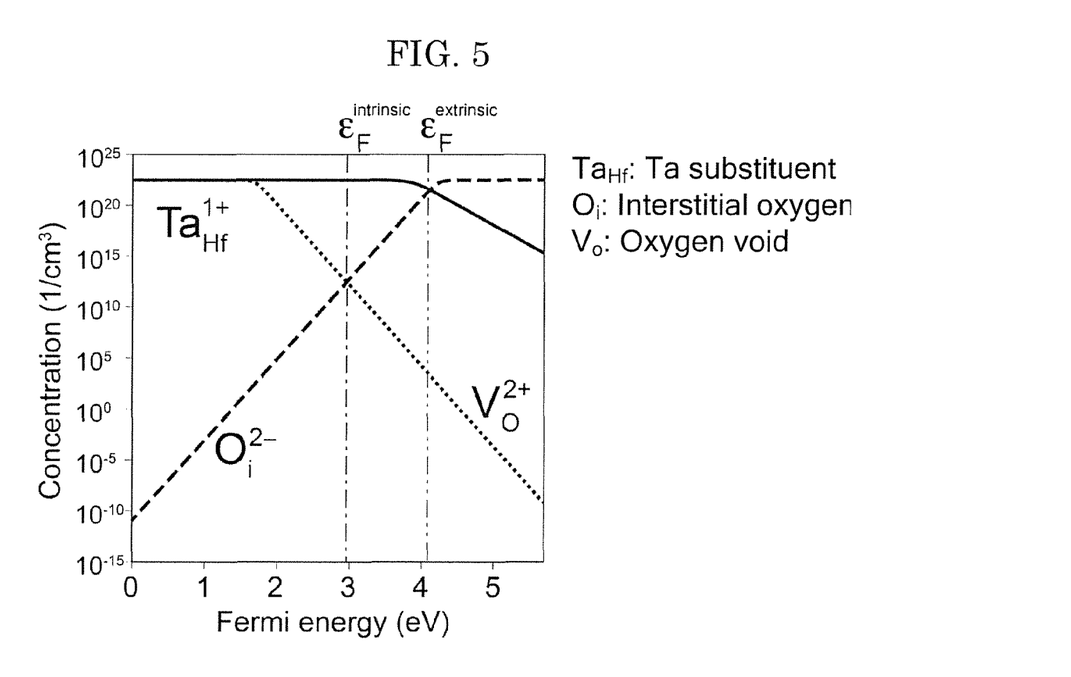
FIG. 5 is a diagram in which the defect density in $HfO_2$ is plotted as function of Fermi energy.

This function is explained based on the theory with reference to FIGS. 3 to 5.

In FIG. 3, as Ta is diffused in $HfO_2$ to substitute an Hf site, an electron is excited to higher level in the band gap. This is because the valency of Ta is higher than the valency of Hf. The electron occupying such high level is electrically unstable, and tends to move back to the lower level, but as illustrated in FIG. 3, the valence band is already occupied and therefore the electron cannot move as it is. Specifically, when Ta substitutes an Hf site ($Ta_{Hf}$), an electron is excited to the high level in the band gap and hence is unstable. Once interstitial oxygen is formed, however, a non-occupied level is formed adjacent to the valence band as illustrated in the top half of FIG. 4, and the electron can moves to stabilize the entire system. Specifically, the electron can move to the low level as a result of the formation of the interstitial oxygen ($O_i$), and it is stabilized.

As the formation of the interstitial oxygen (absorption of oxygen) is accelerated by diffusion of Ta in $HfO_2$, oxygen are withdrawn from the adjacent $SiO_x$ layer to diffuse in $HfO_2$, which the present inventors consider contributes to the reduction in the thickness of the $SiO_x$ interfacial layer. In the bottom halves of FIGS. 3 and 4, conception diagrams each illustrating an interface structure corresponding to the electron state of the respective top half, and diffusion of atoms.

Figure 16:
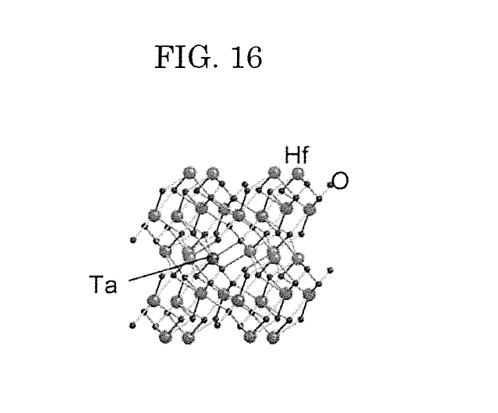
FIG. 16 is a diagram illustrating the relaxed structure of $HfO_2$ monoclinic crystal with 96 atoms, in which one Hf is substituted with Ta.
Figure 17:
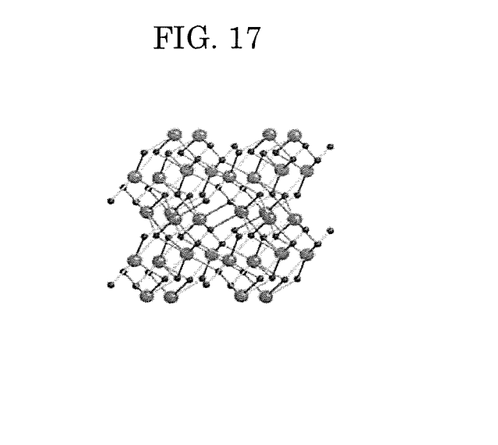
FIG. 17 is a diagram illustrating the relaxed structure of an $HfO_2$ monoclinic crystal with 96 atoms.

A calculation method of a defect density is described below. As an example, a procedure of calculating a density of defect (Ta substitute) in an $HfO_2$ monoclinic crystal with 96 atoms, in which one Hf atom is substituted with Ta, will be explained. According to the first-principle calculation, the structure of the crystal to which the defect has been introduced is relaxed (illustrated in FIG. 16), and the total energy is estimated. Then, a difference between the estimated total energy and a total energy without defect is obtained. Note that, the relaxed structure of $HfO_2$ monoclinic crystal with 96 atoms is illustrated in FIG. 17. Next, chemical potential of each of Hf and Ta is estimated from the experimental value of enthalpy of formation of each of $HfO_2$ and $Ta_2O_5$ (see O. Kubaschewski, C. B. Alcock, and P. J. Spencer, in Materials Thermochemistry 6th edition (Pergamon Press, April 1993)).

The chemical potential of oxygen is obtained from a difference between the total bulk energy of $SiO_2$ and that of Si.

This is because a formation of $HfO_2$ on the Si substrate is taken into consideration. Accordingly, formation energy is represented as function only of Fermi energy. Using this formation energy, the defect density is calculated by the formula presented in the following calculation formula 2. The temperature was set to 1,000° C.

$$E_f(Ta_{Hf}^+) = E_{tot}(Ta_{Hf}^+) - E_{tot}^{bulk}(HfO_2) + \mu_{Hf} - \mu_{Ta} + \in_F \quad \text{Calculation Formula 1}$$

In the formula 1 above, the abbreviations are as follows:
$E_f(Ta_{Hf}^+)$: energy for forming the Ta substitute
$E_{tot}(Ta_{Hf}^+)$: total energy of the relaxed structure of FIG. 16
$E_{tot}^{bulk}(HfO_2)$ total energy of the relaxed structure of FIG. 17

Further, in the formula 1, $\in_F$ is the Fermi energy (factor), and $\mu_{Ta}$ and $\mu_{Hf}$ are chemical potentials calculated by the following formulae:

$$\mu_{Ta} = (\mu_{Ta_2O_5} - 5\mu_O)/2 \quad \text{Calculation Formula 2}$$

$$\mu_{Hf} = \mu_{HfO_2} - 2\mu_O$$

$$\mu_O = (\mu_{SiO_2} - \mu_{Si})/2$$

$$C = \frac{N_{sites}}{e^{E_f/k_BT} + 1}$$

In the calculation formula 2 above, C denotes a defect density, $N_{sites}$ denotes the number of substituted sites, $k_B$ denotes Boltzmann factor, and T denotes temperature (set to 1,000° C.).

FIG. 5 illustrates the result obtained by plotting the defect density in $HfO_2$ as a function of Fermi energy, which obtained by the aforementioned calculation method for the defect density. Note that, in FIG. 5, a relationship between an increase in Fermi level and an increase in interstitial oxygen. When Ta is not added, charge neutrality is achieve at the point where the density of the positively charged oxygen void ($V_O^{2+}$) and the density of the negatively charged interstitial oxygen ($O_i^{2-}$) meet. This point is considered as Fermi level specific to $HfO_2$ ($\in_F^{intrinsic}$). When Ta is not added, the density of $Ta^{1+}$ is greater than the density of $V_O^{2+}$, and thus charge neutrality is achieved at the point where the density of $Ta^{1+}$ is twice the density of $O_i^{2-}$. The Fermi level ($\in_F^{extrinsic}$) determined by the aforementioned condition is positioned at the higher energy side than $\in_F^{intrinsic}$, and therefore, it can be said that the Fermi level is shifted upwards by the addition of Ta. As a result of this shift, it can be seen that the density of the interstitial oxygen increases, and the density of the oxygen void. That means, the density of oxygen in $HfO_2$ increases as Ta is added. This calculation result proves the theoretical interpretation of the function of the present invention explained with reference to FIGS. 3 and 4.

Here, a difference between the present invention with the technologies disclosed in H. Kim, et al., "Engineering Chemically Abrupt High-k Metal Oxide/Silicon Interfaces Using an Oxygen-Gettering Metal Overlayer," JOURNAL OF APPLIED PHYSICS 96, 3467 (2004), and M. P. Agustin et al., "Influence of AlN layers on the interface stability of $HfO_2$ gate dielectric stacks," APPLIED PHYSICS LETTERS 89, 041906 (2006) will be explained. In these related arts, a film capping a high dielectric film takes oxygen out of the high dielectric film, and therefore there is a problem, as already explained, that a reliability of a resulting device is deteriorated. As it is clear from the descriptions above, in the present invention, the high dielectric film itself absorbs oxygen, and therefore no oxygen void is formed in the high dielectric film, which does not lower the reliability of the resulting device.

When adjacent oxygen is withdrawn by diffusion of Ta in $HfO_2$, it is preferred that withdrawing of oxygen do not occur from the side of $Ta_2O_5$ as less as possible. When an oxide film with an excessive oxygen content is formed during the formation a film of Ta oxide, this oxide film functions as an oxygen source, to thereby reduce an amount of withdrawing oxygen from the side of $SiO_x$. In order to prevent this phenomenon, at the time of forming the film, a film of $Ta_2O_{5-x}$, which has deficiency from the stoichiometric formulation $Ta_2O_5$ of Ta oxide, should be formed.

When a film is formed with a mixture of Ta and Hf which are mixed in advance to the film forming, oxygen and thermal equilibrium in the atmosphere is saturated, Ta loses an effect of withdrawing oxygen from $SiO_x$. Accordingly, as in the present example, a film of reduced, i.e., oxygen deficient, $Ta_2O_{5-x}$ needs to be form on $HfO_2$.

In the case where a gate insulating film is formed in accordance with the present invention, the $Ta_2O_5$, layer deposited on the $HfO_2$ layer also functions as a gate insulating film, and therefore a thickness of the gate insulating film increases as it is. When the thickness of the gate insulating film is greater than the required thickness, at least part of the side of the $Ta_2O_{5-x}$ layer (it is actually a $TaHfO_x$ layer in which Ta and Hf are mixed, as mentioned earlier) is removed by wet etching or the like. In the layer structure produced in the aforementioned manner, the side of the $HfO_2$ layer is crystallized whereas the side of the $Ta_2O_5$ layer is amorphous. Accordingly, the $HfO_2$ layer itself plays a roll as a stopper for etching, and thus the operation of the etching is easily controlled.

The effect obtainable by the present invention is largely resulted from the fact that the valency of Ta, which is a metal element of the laminated oxide, is larger than the valency of Hf, tetravalent. Accordingly, the present invention is not limited to the combination of $HfO_2$ and $Ta_2O_{5-x}$, and it is expected that the same effect can be attained as long as it is a combination of an oxide of a tetravalent metal, such as $HfO_2$, $ZrO_2$, and $TiO_2$, and oxide of a pentavalent metal such as $Ta_2O_{(5-x)}$, $Nb_2O_{5-x}$, and $V_2O_{5-x}$. Moreover, each film is not necessarily formed of an oxide of a single metal, and a film constituted of a plurality of metal oxides satisfying the condition above can also exhibits the same effect. For example, not only a film formed solely of $HfO_2$, a high dielectric film can also be produced of a solid solution of $HfO_2$ and $TiO_2$. The same can be said to the laminated oxide.

Further, Example 1 is explained using silicon as an example of a semiconductor, but the present invention can exhibit an effect of reducing an interfacial layer to a semiconductor other than silicon, for example, various compound semiconductors such as germanium (Ge) and gallium arsenide (GaAs), where the interfacial layer is formed by oxidization of silicon oxide formed between the dielectric material and the semiconductor, or an another layer (interface deficiency reducing layer) of $Si/SiN_x$, Ge, or $Ga_2O_3$ inserted between the dielectric material and the semiconductor.

Example 2

An example where the present invention is applied to a production method of a complementary metal oxide semiconductor (CMOS) integrated circuit constituted of an n-channel and p-channel MOS transistors will be explained with reference to FIGS. 6 to 15. On the actual practice, numbers of transistors are formed on a semiconductor substrate, but in the following example, it is explained, for easiness in understanding, as if one n-channel MOS transistor and one p-channel MOS transistor are produced.

Figure 6:
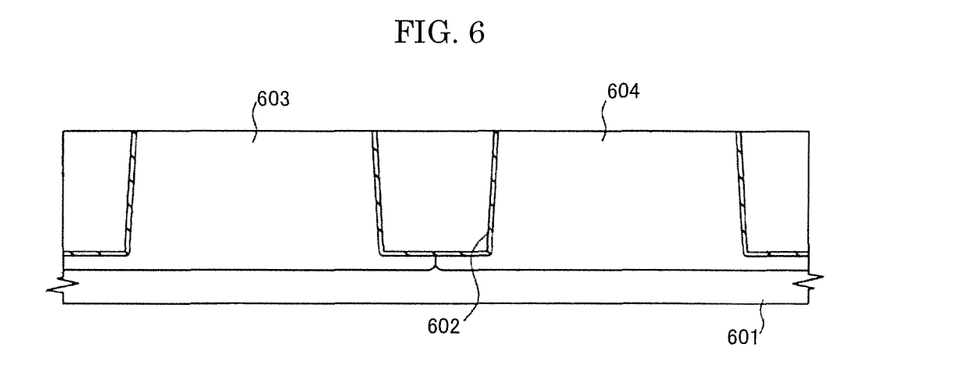
FIG. 6 is a diagram for explaining a method for producing a CMOS structure in Example of the present invention.

First, as illustrated in FIG. 6, for example, an element isolation trench 602 was formed in a main surface of a semiconductor substrate formed of a p-type monocrystal silicon (referred to as the substrate, hereinafter) 601 by the conventional shallow trench isolation technique.

Subsequently, an n-channel MOS transistor forming region (left half in the figure, which is the same in the following figures) of the substrate 601 was doped with boron by ion implantation, and a p-channel MOS transistor forming region (right half in the figure, which is the same in the following figures) was doped with phosphorous by ion implantation. Subsequently, the n-MOS forming region and p-MOS region of the substrate 601 was doped with impurities by ion implantation to control the threshold voltage of the MOS transistor. Further, the substrate 601 was subjected to heat treatment to diffuse the impurities in the substrate 601, to thereby form a p-type well 603 and n-type well 604 in the main surface of the substrate 601.

Figure 7:
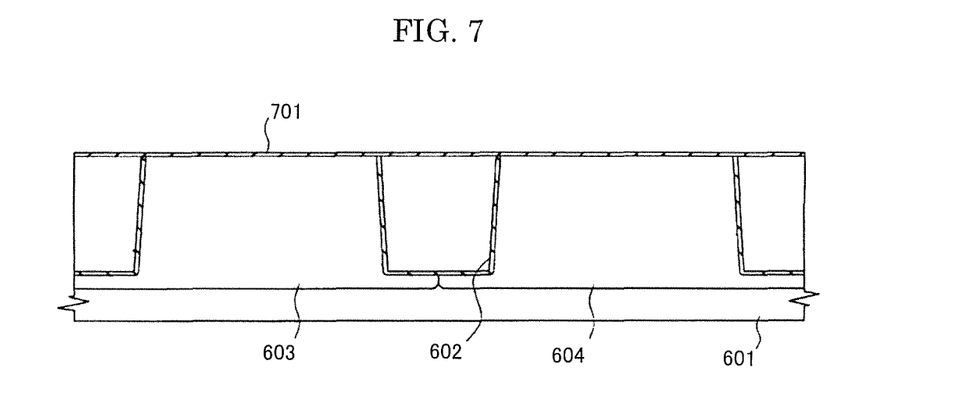
FIG. 7 is a diagram for explaining a method for producing a CMOS structure in Example of the present invention.

Subsequently, as illustrated in FIG. 7, an interfacial layer formed of silicon oxide ($SiO_2$) was formed on each surface of the p-type well 603 of the n-MOS forming region and n-type well 604 of the p-MOS forming region, followed by forming thereon a gate insulating film 701 formed of hafnium oxide ($HfO_2$). Since an ultrathin (e.g., about 0.3 nm to about 0.5 nm) silicon oxide interfacial layer for reducing deficiency is provided at an interface between hafnium oxide and silicon for improving the properties of the resulting transistor, the layer structure similar to that of Example 1 was produced here.

After removing a natural oxide film on a surface of a Si substrate with a diluted hydrofluoric acid solution, the Si substrate was treated by subjected to high temperature heating oxidation at 950° C. or higher, to thereby produce the silicon oxide film. Subsequently, the hafnium oxide film is formed, for example, by atomic layer deposition (ALD) using $H_2O$ as an oxygen (O) raw material, and TEMAHf (tetrakis-ethylmethylamido-hafnium:Hf(NEtMe)$_4$) as a hafnium (Hf) raw material, and performing post deposition annealing (PDA) at 700° C. or higher to reduce deficiency in the film.

As depicted in the cross-sectional TEM image of FIG. 1, during the PDA at 1,050° C., the oxidation reaction progressed in the silicon substrate by releasing the oxygen from the hafnium oxide film, and as a result, a silicon oxide film having a thickness of 1.6 nm was formed.

Here, an oxygen deficient tantalum oxide ($Ta_2O_{5-x}$) film was deposited in a thickness of about 5 nm on the hafnium oxide/silicon oxide film laminate structure by low oxygen partial pressure pulsed laser deposition using a tantalum oxide target. Ta atoms are diffused in the hafnium oxide film by migration to form a TaHfO$_x$ structure in the tantalum oxide film. As a result of the migration of the Ta atoms in the HfO$_2$ film, there is a change from the stoichiometry and insufficiency of oxygen occurs, to thereby release oxygen from the $SiO_2$ film. As a result, the $SiO_2$ film becomes a silicon suboxide film ($SiO_{2-x}$) to cause evaporation or the like, which leads to a reduction in the thickness of the silicon oxide film.

As illustrated in FIGS. 2(a) and 2(b), the presence of Ta atoms in the hafnium oxide film can be also confirmed by a backside SIMS analysis. Other than the method described above, the oxygen deficient tantalum oxide film can also be produced by performing low temperature oxidation after depositing a metal tantalum film by sputtering or electron beam deposition using tantalum metal as a target. The thickness of the tantalum oxide film is 10% or more relative to the thickness of the hafnium oxide film.

Next, the excessive portion of the tantalum oxide film, which does not contribute to the formation of the TaHfO$_x$ structure is removed by an acid wet etching or dry etching process. In either etching process, the tantalum oxide film can be removed by utilizing the selectivity of the tantalum oxide film and the TaHfO$_x$ film. By removing the excessive portion of the tantalum oxide film, the thickness of the gate insulating film can be reduced.

Next, heat treatment was performed to make the TaHfO$_x$ film dense, but this treatment was performed in a reduced atmosphere of hydrogen gas and/or nitrogen gas atmosphere for the purpose of preventing reemission of oxygen from the TaHfO$_x$ film. Other than the method as described, the hafnium oxide film may be deposited by metal organic chemical vapor deposition (MOCVD), sputtering, or electron beam deposition.

This hafnium oxide is hafnium-based oxide having higher dielectric constant than that of the silicon oxide. Giving that the dielectric constant of the gate insulating film 701 constituted of the hafnium oxide is 16 and the thickness of the hafnium oxide is, for example, 2 nm, an equivalent oxide thickness (EOT) of silicon oxide is, for example, 0.5 nm. In this case, the leak current of the MOS transistor when it is turned on (ON-state) can be reduced compared to that thereof the gate insulating film MOS transistor containing the silicon oxide of the same thickness.

Figure 8:
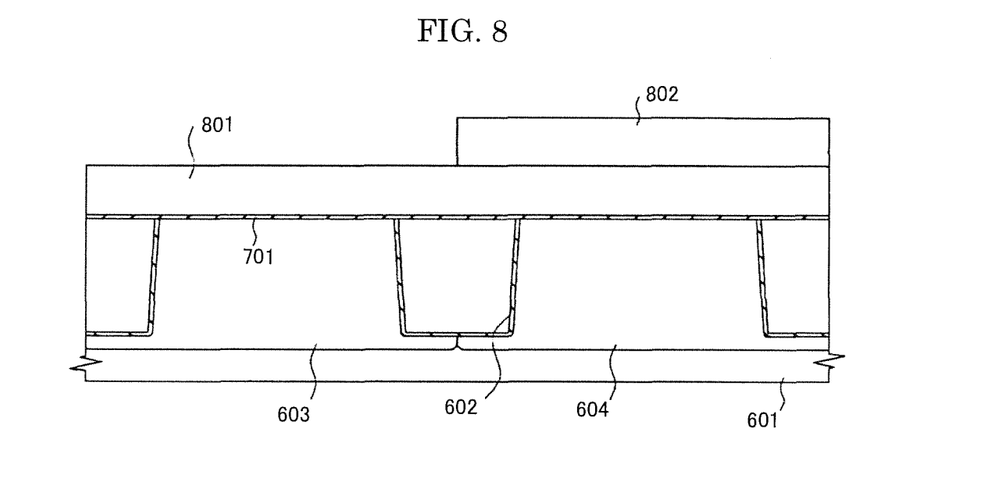
FIG. 8 is a diagram for explaining a method for producing a CMOS structure in Example of the present invention.

Subsequently, as illustrated in FIG. 8, a metal nitride film 801 constituted of titanium nitride (TiN) was deposited (formed) on the gate insulating film 701 by sputtering, a silicon nitride film is then deposited on the metal nitride film 801 by CVD, followed by patterning the silicon nitride film by dry etching using a photoresist film (not illustrated) as a mask, to thereby form a hard mask 802 in the p-MOS forming region. In the present example, the thickness of the metal nitride film 801 constituted of titanium nitride is, for example, 20 nm.

Figure 9:
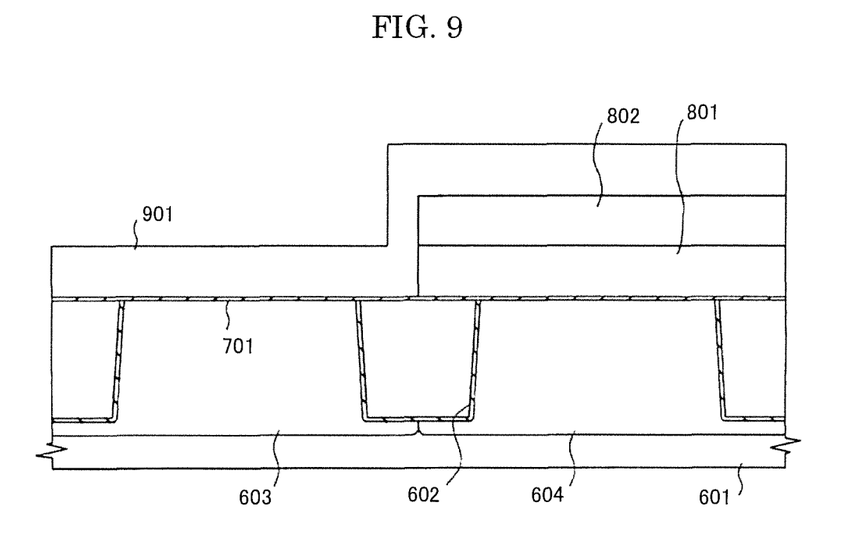
FIG. 9 is a diagram for explaining a method for producing a CMOS structure in Example of the present invention.

Subsequently, as illustrated in FIG. 9, the metal nitride film 801 in the n-MOS forming region was removed by etching to expose the gate insulating film 701 of the n-MOS forming region, followed by depositing (forming) a metal nitride film 901 constituted of titanium aluminum nitride (TiAlN) on the gate insulating film 701 by sputtering.

Subsequently, a silicon nitride film was deposited on the metal nitride film 901 by CVD, and patterning was performed in the silicon nitride film by dry etching using a photoresist film (not illustrated) as a mask to form a hard mask in the n-MOS forming region, followed by removing the metal nitride film 901 in the p-MOS forming region by etching.

Figure 10:
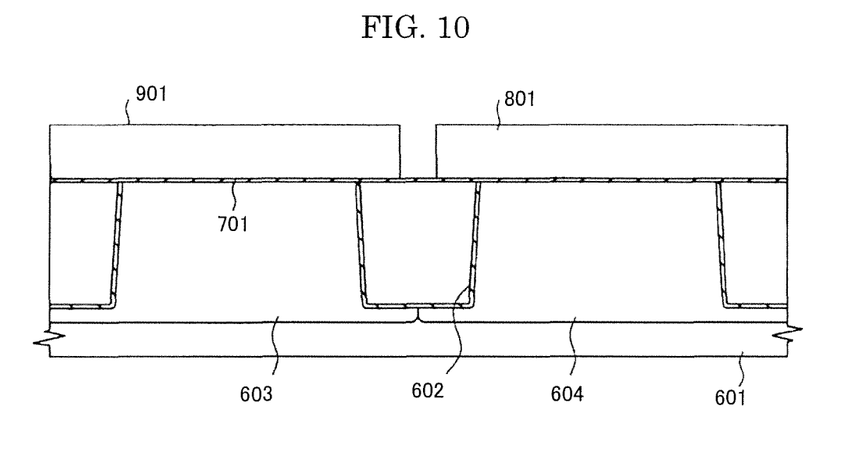
FIG. 10 is a diagram for explaining a method for producing a CMOS structure in Example of the present invention.

Subsequently, as illustrated in FIG. 10, the hard mask 802 of the p-MOS forming region was removed.

Figure 11:
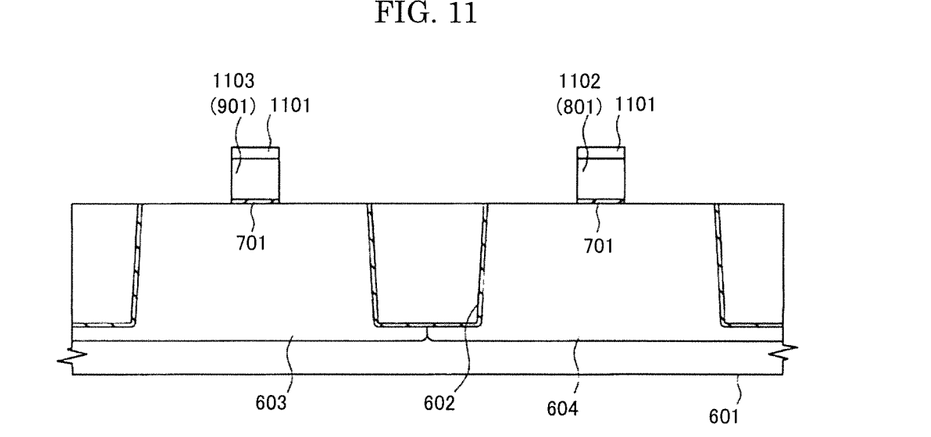
FIG. 11 is a diagram for explaining a method for producing a CMOS structure in Example of the present invention.

Subsequently, as illustrated in FIG. 11, a capping layer 1101 constituted of tantalum nitride (barrier metal) was deposited (formed) on the metal nitride film 801 of the p-MOS forming region, and on the metal nitride film 901 of the n-MOS forming region, followed by patterning the capping layer 1101, and metal nitride films 801 and 901 by dry etching using a photoresist film (not illustrated) as a mask. As a result, a gate electrode 1102 formed of the metal nitride film 801 and a gate electrode 1103 formed of the metal nitride film 901 were respectively formed on the gate insulating film 701 of the n-type well 604, and on the gate insulating film 701 of the p-type well 603.

The capping layer 1101 is constituted of barrier metal, which is provided for preventing oxygen to reach the metal nitride films 801 and 901 even when the substrate 601 is exposed to the atmosphere including oxygen, and in the present example, tantalum nitride is used as the barrier metal.

Note that, it is also acceptable that the capping layer 1101 does not present in the p-MOS forming region.

Figure 12:
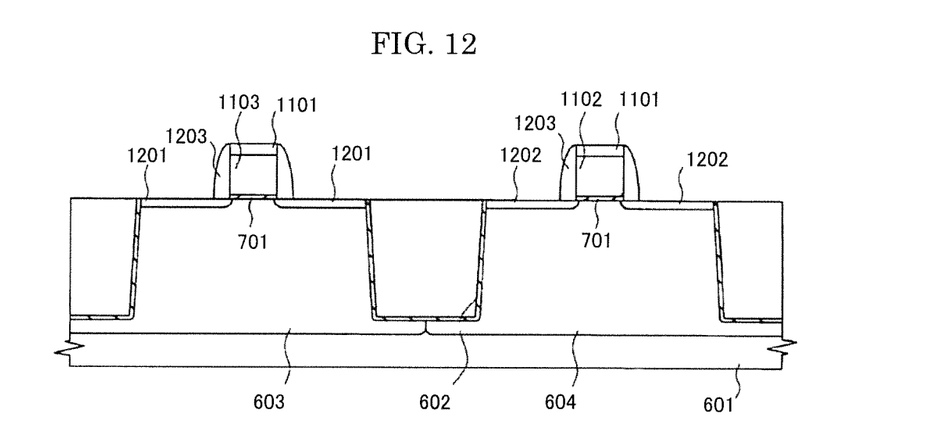
FIG. 12 is a diagram for explaining a method for producing a CMOS structure in Example of the present invention.

Subsequently, as illustrated in FIG. 12, the p-type well 603 was doped with phosphorous or arsenic by ion implantation to form an n-type semiconductor region 1201, and the n-type well 604 was doped with boron by ion implantation to form a p-type semiconductor region 1202, followed by forming a side wall spacer 1203 at the side walls of the gate electrode 1102 and the gate electrode 1103. The n-type semiconductor region 1201 was formed to make the n-channel MOS transistor have a lightly doped drain (LDD) structure, and the p-type semiconductor region 1202 was formed to make the p-channel MOS transistor have the LDD structure. The side wall spacer 1203 was formed by depositing a silicon oxide film on the substrate 601 by CVD, followed by anisotropic etching the silicon oxide film.

Figure 13:
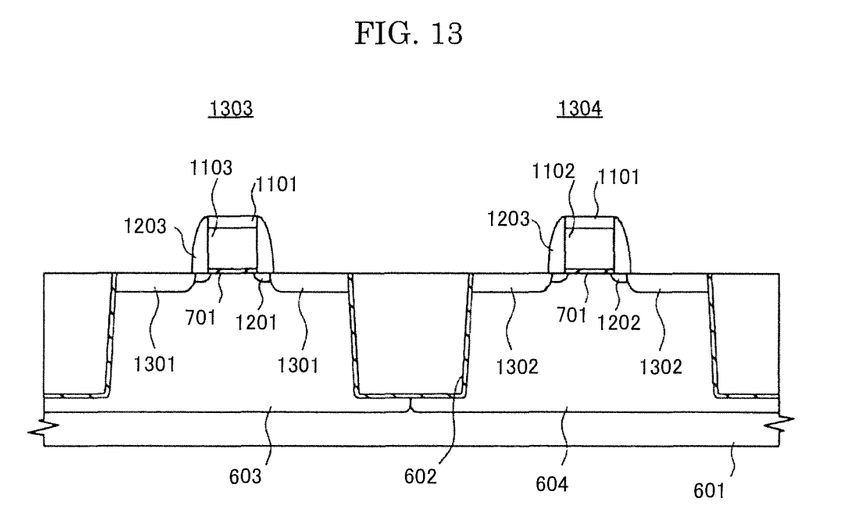
FIG. 13 is a diagram for explaining a method for producing a CMOS structure in Example of the present invention.

Subsequently, as illustrated in FIG. 13, the p-type well 603 was doped with phosphorous or arsenic by ion implantation, and the n-type well 604 was doped with boron by ion implantation. Thereafter, the substrate 601 was subjected to heat treatment to diffuse these impurities to thereby form an n⁺-type semiconductor region (source-drain) 1301 in the p-type well 603, and a p⁺-type semiconductor region (source-drain) 1302 in the n-type well 604.

Figure 14:
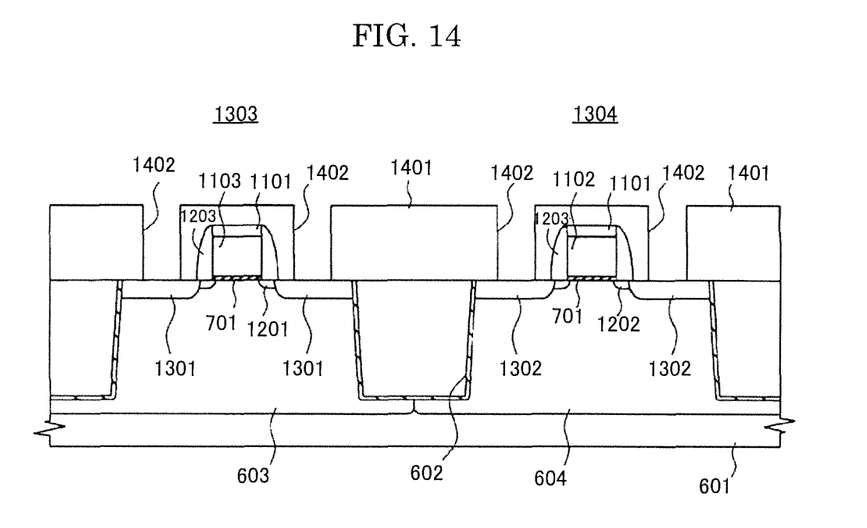
FIG. 14 is a diagram for explaining a method for producing a CMOS structure in Example of the present invention.

Subsequently, as illustrated in FIG. 14, an interlayer insulating film 1401 constituted of silicon oxide was formed on the substrate 601 by CVD, and a surface of the interlayer insulating film 1401 was leveled by chemical mechanical polishing, followed by forming a contact hole 1402 at the upper portion of the n⁺-semiconductor region (source-drain) 1301 and the upper portion of the p⁺-semiconductor region (source-drain) 1302 by dry etching the interlayer insulating film 1401 using a photoresist film as a mask.

Figure 15:
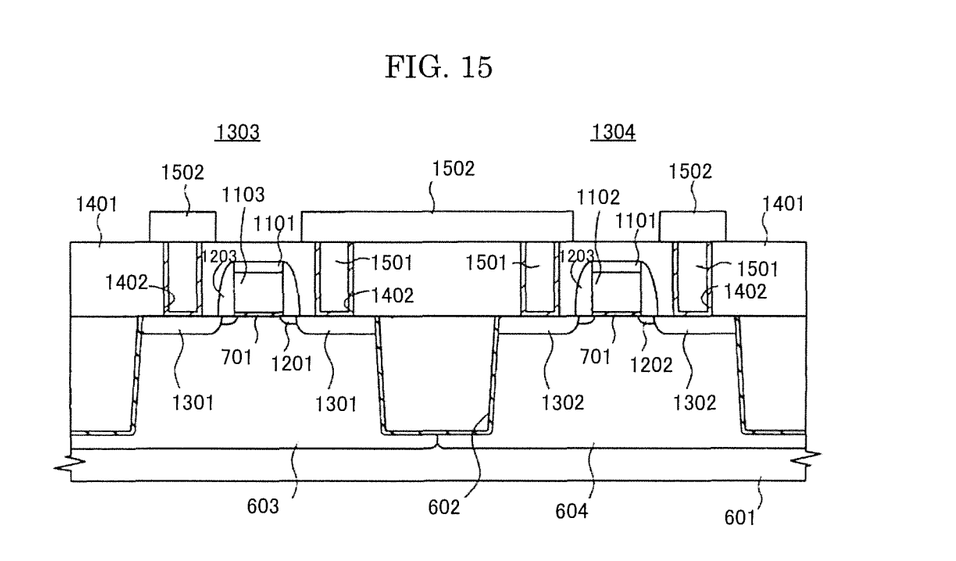
FIG. 15 is a diagram for explaining a method for producing a CMOS structure in Example of the present invention.

Subsequently, as illustrated in FIG. 15, a plug 1501 was formed within the contact hole 1402, followed by forming metal lines 1502 at the upper portion of the interlayer insulating film 1401. For forming the plug 1501, titanium nitride (TiN) film and a tungsten (W) film were deposited on the interlayer insulating film 1401 including the area inside the contact hole 1402 by sputtering, followed by removing the TiN film and the W film on the interlayer insulating film 1401 by chemical mechanical polishing. For forming the metal lines 1502, moreover, a metal film, such as a W film and Al alloy film, was deposited on the interlayer insulating film 1401 by sputtering, followed by patterning the metal film by dry etching using a photoresist film (not illustrated) as a mask.

By the operations as described so far, an n-channel MOS transistor 1303 and p-channel MOS transistor 1304 each having a gate insulating film with a silicone oxide film of the reduced thickness can be completed.

As has been specifically explained above, the present invention is novel in that a thickness of an interfacial layer can be thinned after forming the interfacial layer and from the area which is not directly in contact with the interfacial layer. Accordingly, the present invention gives a new selection and degree of freedom in a process for forming a gate oxide film of high effective dielectric constant, and remarkably effective on the actual practices.

What is claimed is:

1. A high dielectric constant gate oxide film, comprising:
   an oxide of a first metal; and
   a second metal, which is at least one metal selected from metals having higher valency than that of the first metal diffused in the oxide of the first metal,
   wherein the oxide of the first metal is an oxide of at least one metal selected from metals having larger dielectric constant than that of an oxide of a semiconductor layer present below the high dielectric constant gate oxide film, or that of an oxide of a layer provided between the semiconductor layer and the high dielectric constant gate oxide film.

2. The high dielectric constant gate oxide film according to claim 1, wherein a material for forming the semiconductor layer is silicon, and the oxide of the first metal is an oxide of at least one metal selected from metals having larger dielectric constant than that of silicon oxide.

3. The high dielectric constant gate oxide film according to claim 2, wherein the first metal is at least one metal selected from the group consisting of hafnium (Hf), zirconium (Zr), and titanium (Ti), and the second metal is at least one metal selected from the group consisting of tantalum (Ta), niobium (Nb), and vanadium (V).

4. The high dielectric constant gate oxide film according to claim 3, wherein the oxide of the first metal is hafnium oxide, and the second metal is tantalum.

5. The high dielectric constant gate oxide film according to claim 4, wherein a concentration of the tantalum is $10^{20}$ atom/cm³ to $10^{22}$ atom/cm³.

* * * * *